US010099365B2

United States Patent
Fujita et al.

(10) Patent No.: US 10,099,365 B2
(45) Date of Patent: Oct. 16, 2018

(54) WORK MACHINE PROVIDED WITH ARTICULATED ROBOT AND ELECTRIC COMPONENT MOUNTING MACHINE

(75) Inventors: Masatoshi Fujita, Anjyo (JP); Seigo Kodama, Ama-gun (JP); Ryo Nagata, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 300 days.

(21) Appl. No.: 14/418,797

(22) PCT Filed: Aug. 2, 2012

(86) PCT No.: PCT/JP2012/069681
§ 371 (c)(1),
(2), (4) Date: Jan. 30, 2015

(87) PCT Pub. No.: WO2014/020739
PCT Pub. Date: Feb. 6, 2014

(65) Prior Publication Data
US 2015/0158176 A1    Jun. 11, 2015

(51) Int. Cl.
*B25J 9/00* (2006.01)
*G05B 19/418* (2006.01)
(Continued)

(52) U.S. Cl.
CPC ........... *B25J 9/0096* (2013.01); *B25J 9/1697* (2013.01); *G05B 19/418* (2013.01);
(Continued)

(58) Field of Classification Search
CPC . G05B 19/418; B25J 9/0096; H05K 13/0404; H05K 13/08
(Continued)

(56) References Cited

U.S. PATENT DOCUMENTS

| | | | | |
|---|---|---|---|---|
| 4,753,569 A | * | 6/1988 | Pryor | ................... A01B 69/008 250/201.1 |
| 2002/0157488 A1 | * | 10/2002 | Nagafuku | .............. H05K 13/08 73/866.5 |

(Continued)

FOREIGN PATENT DOCUMENTS

| | | |
|---|---|---|
| CN | 1470368 A | 1/2004 |
| CN | 101909828 A | 12/2010 |

(Continued)

OTHER PUBLICATIONS

International Search Report dated Nov. 6, 2012 in PCT/JP12/069681 filed Aug. 2, 2012.

*Primary Examiner* — Mohammad Ali
*Assistant Examiner* — Joshua Sanders
(74) *Attorney, Agent, or Firm* — Oblon, McClelland, Maier & Neustadt, L.L.P.

(57) ABSTRACT

In a work machine including an articulated robot which is provided with a work head and moves the work head, imaging devices which image at least part of a workpiece or part of the work machine are attached to a distal end of the robot, and a target operation position of the robot is corrected on the basis of position data regarding a plurality of feature points of the workpiece, created on the basis of imaging data obtained through imaging performed by the imaging devices and design data of the workpiece, or position data regarding a plurality of feature points set for the work machine.

5 Claims, 4 Drawing Sheets

(51) Int. Cl.
*B25J 9/16* (2006.01)
*H05K 13/04* (2006.01)
*H05K 13/08* (2006.01)

(52) U.S. Cl.
CPC ......... *H05K 13/0404* (2013.01); *H05K 13/08* (2013.01); *G05B 2219/40613* (2013.01); *G05B 2219/45029* (2013.01); *G05B 2219/45031* (2013.01); *Y10S 901/02* (2013.01); *Y10S 901/41* (2013.01); *Y10S 901/47* (2013.01)

(58) Field of Classification Search
USPC .......................................................... 700/97
See application file for complete search history.

(56) References Cited

U.S. PATENT DOCUMENTS

2011/0004343 A1  1/2011  Iida
2011/0234788 A1  9/2011  Koike et al.
2012/0327224 A1* 12/2012  Nomura ................. B25J 9/1671
                                                    348/139

FOREIGN PATENT DOCUMENTS

| | | |
|---|---|---|
| CN | 102207370 A | 10/2011 |
| JP | 02-274442 | 11/1990 |
| JP | 06-134691 | 5/1994 |
| JP | 08-141962 | 6/1996 |
| JP | 2003-069288 | 3/2003 |
| JP | 2003069288 A * | 3/2003 |
| JP | 2003-305676 | 10/2003 |
| JP | 2009-000782 | 1/2009 |
| JP | 2011-011318 | 1/2011 |
| JP | 2011186928 A * | 9/2011 ............ B25J 9/1671 |
| JP | 2011-206878 | 10/2011 |
| KR | 20110010422 A * | 2/2011 |
| WO | 2012-066862 | 5/2012 |

* cited by examiner

[FIG. 1]
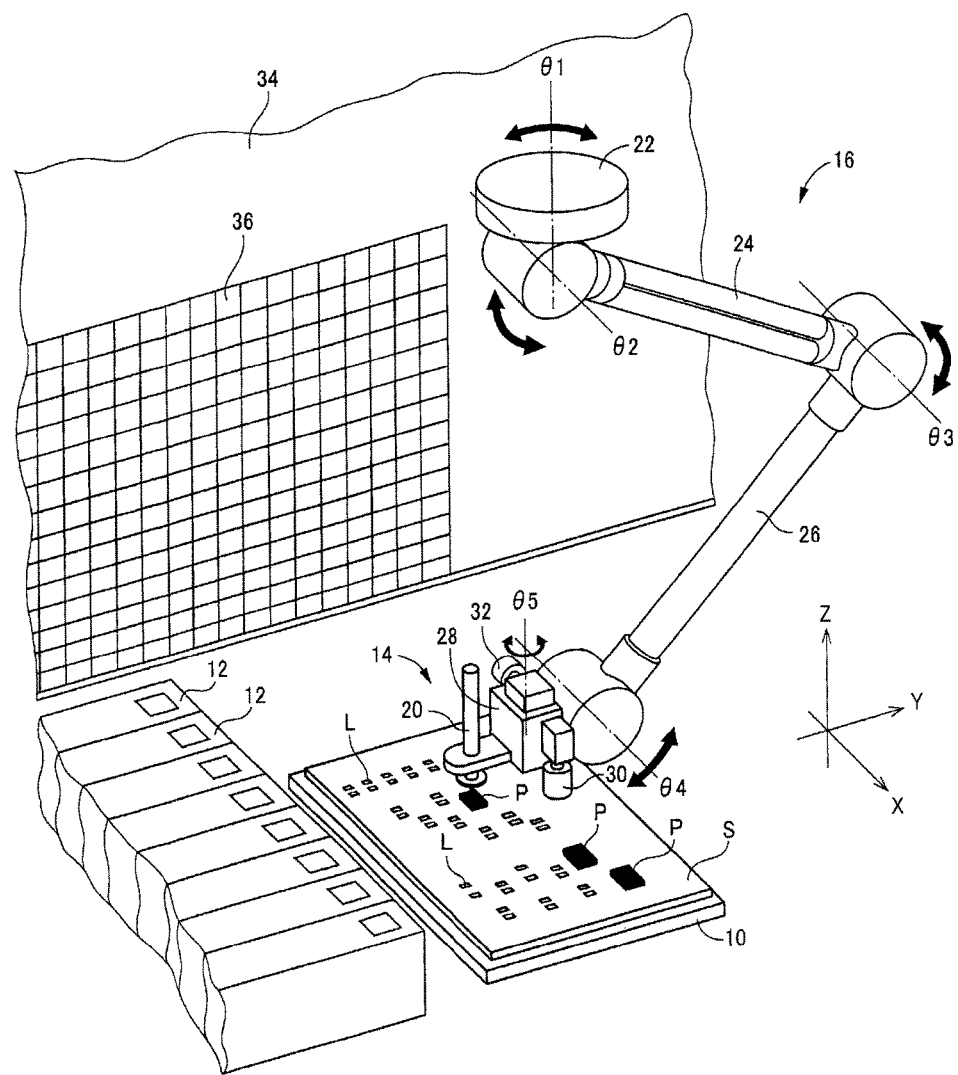

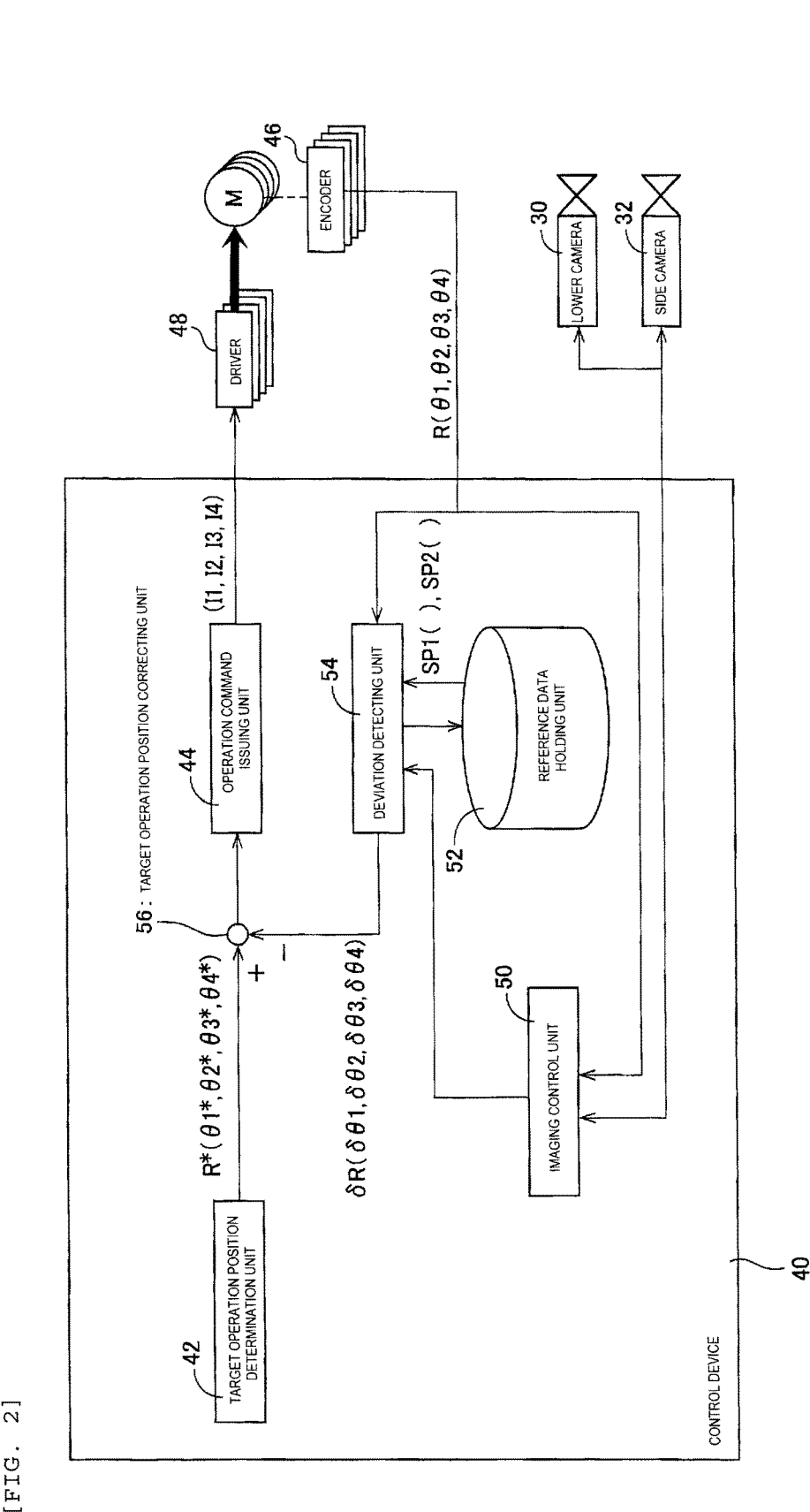
[FIG. 2]

[FIG. 3]
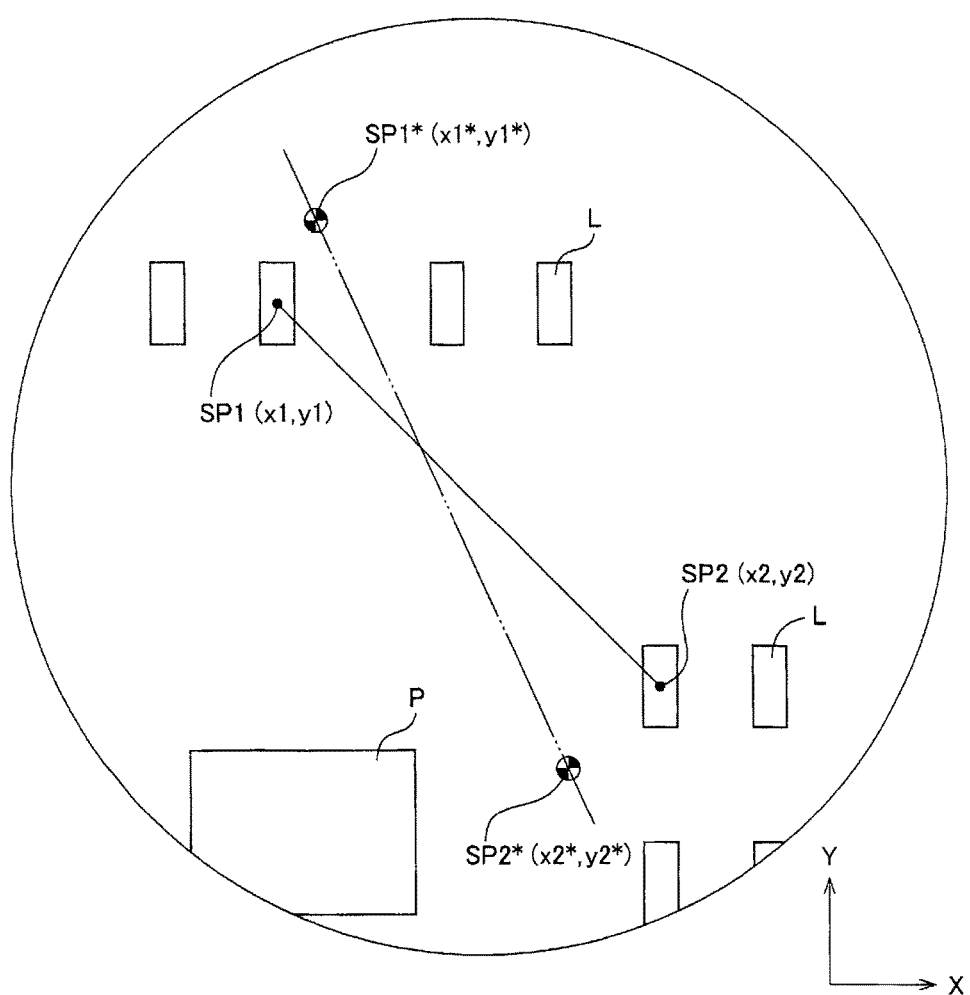

[FIG. 4]
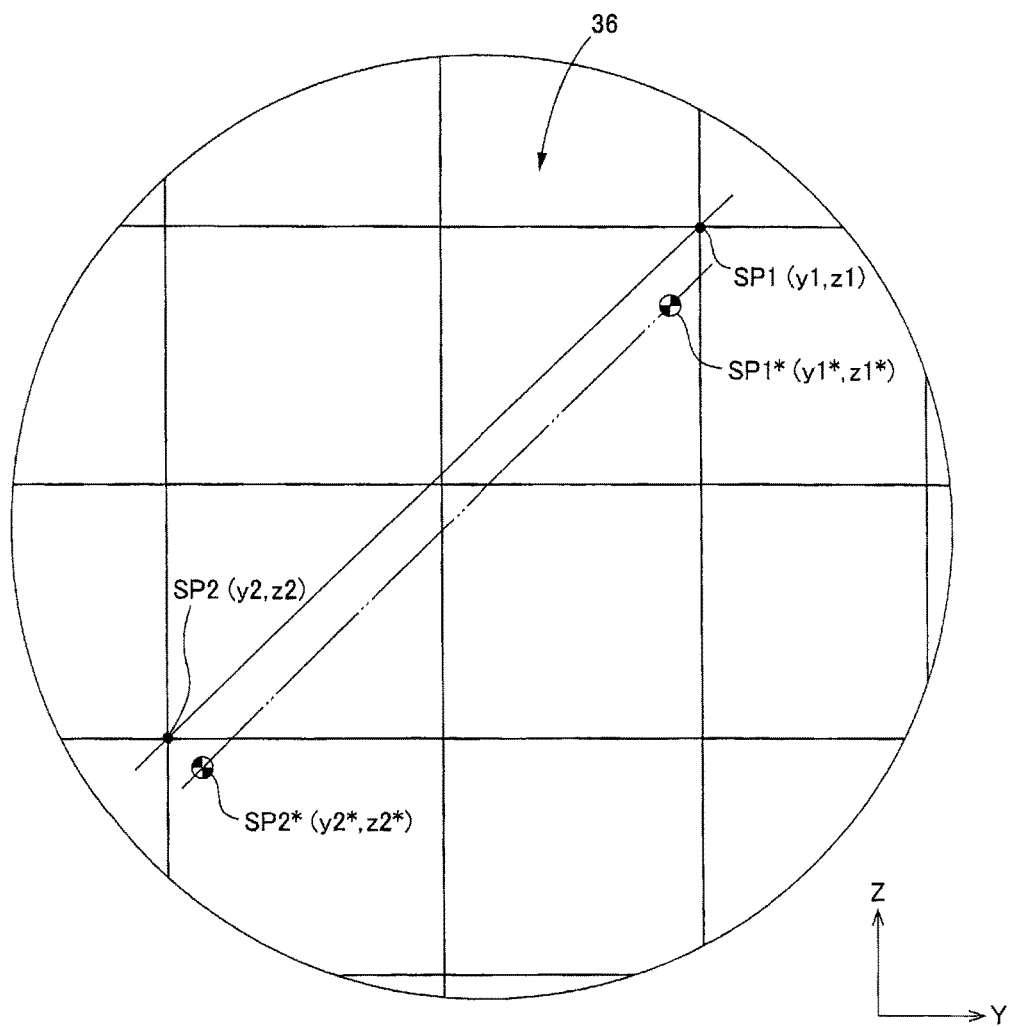

WORK MACHINE PROVIDED WITH ARTICULATED ROBOT AND ELECTRIC COMPONENT MOUNTING MACHINE

TECHNICAL FIELD

The present invention relates to a work machine and an electric component mounting machine for performing work by moving a work head with an articulated robot.

BACKGROUND ART

Regarding a work machine provided with an articulated robot, a technique as disclosed in the following patent literature, specifically, a technique has been examined in which an imaging device is attached to a distal end of the robot, and an operation of the robot is controlled on the basis of imaging data obtained by the imaging device.

CITATION LIST

Patent Literature

Patent literature 1: JP-A-2003-305676

SUMMARY OF INVENTION

Technical Problem

There is a lot of room for improvement in the control of an operation of the articulated robot based on image data, and thus it is possible to increase practicality of a work machine provided with the robot by performing some improvements thereon. In addition, in a case where the work machine is an electric component mounting machine, it is anticipated that the practicality thereof will be considerably increased. The present disclosure has been made in consideration of such circumstances, and an object thereof is to provide a work machine and an electric component mounting machine with high practicality.

Solution to Problem

In order to solve the above-described problem, according to the present disclosure, in a work machine including an articulated robot which is provided with a work head and moves the work head, imaging devices which image at least part of a workpiece or part of the work machine are attached to a distal end of the robot, and a target operation position of the robot is corrected on the basis of position data regarding a plurality of feature points of the workpiece, created on the basis of imaging data obtained through imaging performed by the imaging devices and design data of the workpiece, or position data regarding a plurality of feature points set for the work machine. In addition, according to the present disclosure, in an electric component mounting machine including an articulated robot which is provided with an electric component holding head and moves the electric component holding head, imaging devices, which image at least part of at least one of a circuit board, and an electric component mounted on the circuit board are attached to a distal end of the robot. An operation position of the robot is feedback-controlled on the basis of data, the data being created on the basis of imaging data obtained through imaging performed by the imaging devices and design data of at least one of the circuit board and the electric component.

Advantageous Effects

According to the work machine or the electric component mounting machine of the present disclosure, since an operation of the robot is optimized on the basis of imaging data, specifically, an actual work position of the work head (an electric component holding head in a case of the electric component mounting machine) or an actual movement path of the work head becomes accurate, and thus work can be performed with high accuracy.

BRIEF DESCRIPTION OF DRAWINGS

FIG. 1 is a perspective view of an electric component mounting machine as a work machine according to the Example of the present invention.

FIG. 2 is a functional block diagram of a control device which controls an operation of an articulated robot.

FIG. 3 is a schematic diagram illustrating an image captured by an imaging device during a first correction.

FIG. 4 is a schematic diagram illustrating an image captured by the imaging device during a second correction.

DESCRIPTION OF EMBODIMENT

Hereinafter, a representative embodiment of the present invention will be described in detail with reference to the drawings as Examples of an electric component mounting machine.

Example

(a) Hardware Configuration of Electric Component Mounting Machine

An electric component mounting machine (hereinafter, referred to as a "mounting machine" in some cases) of the Example is a work machine which mounts a plurality of electric components (hereinafter, referred to as "components" in some cases) P on a circuit board (hereinafter, referred to as a "board" in some cases) S, as illustrated in FIG. 1. The mounting machine includes a board holding device 10 which holds the board S at a predetermined work position; a plurality of component supply devices 12 each of which supplies the component P; an electric component holding head (hereinafter, referred to as a "head" in some cases) 14 as a work head which can detachably hold the component P supplied from each of the component supply devices 12; and an articulated robot (hereinafter, referred to as a "robot" in some cases) 16 which holds the head 14 at its distal end and moves the head 14.

The head 14 has a suction nozzle (hereinafter, referred to as a "nozzle" in some cases) 20, and suctions and holds the component P at a lower end of the nozzle 20 in a detachable manner due to an action of supplied negative pressure. The head 14 is a general one, and includes a nozzle lifting device, a nozzle rotation device, and the like in addition to the nozzle 20, which are stored in a case. In the figures, the case, the devices, a tube for supplying negative pressure to the nozzle 20, and the like are not illustrated.

The robot 16 has a configuration in which a base (not illustrated) is fixed to a beam (not illustrated) which forms part of a body of the mounting machine, and a shoulder 22 rotates around an axial line $\theta 1$ in a horizontal plane with respect to the base. In addition, an upper arm 24 is rotated around an axial line $\theta 2$ with respect to the shoulder 22; a lower arm 26 is rotated around an axial line $\theta 3$ with respect to the upper arm 24; and a wrist 28 to which the head 14 is fixed and held is rotated around an axial line θ4 with respect to the lower arm 26. In other words, the robot 16 is a serial link type robot having four control axes. Further, the shoulder 22, the upper arm 24, the lower arm 26, and the wrist 28 are separately rotated by four respective motors corresponding to the four control axes. Furthermore, in order to identify a rotation position (rotation angle) of each of the shoulder 22, the upper arm 24, the lower arm 26, and the wrist 28, an encoder is provided in each motor.

A lower camera 30 and a side camera 32 each of which functions as an imaging device are attached to the wrist 28. The lower camera 30 mainly images workpieces, that is, part of the board S held by the board holding device 10, and the component P which has already been mounted on the board S. On the other hand, the side camera 32 images part of a reference matrix 36 which is drawn on an inner surface of a panel 34 of the mounting machine. In addition, although detailed description is omitted, the side camera 32 is rotated around an axial line θ5 parallel to the axis θ1 of the shoulder 22 in accordance with the rotation of the shoulder 22, and images the reference matrix 36 while facing the panel 34 at all times.

(b) Fundamental Control for Articulated Robot

The mounting work of the component P by the mounting machine is performed by moving the head 14 with the robot 16. Specifically, first, the head 14 is moved so that the nozzle 20 is located over the component supply device 12 which supplies the component P to be mounted; the component P is held by the nozzle 20; then, the head 14 is moved so that the nozzle 20 is located over a mounting position of the component P in the board S held by the board holding device 10; and the held component P is released at the position. This series of mounting operations is repeatedly performed for each of the components P to be mounted, and thus the mounting work on a single board S is performed. In addition, suction, holding, and releasing operations of the component P are performed by lifting the nozzle 20 with the nozzle lifting device. In addition, although detailed description is omitted, during the releasing of the component P, that is, during the mounting operation of the component P, the nozzle 20 is rotated and moved by the nozzle rotation device in order to optimize the posture of the component P in the horizontal plane.

The movement of the head 14 during the mounting work is controlled as a result of an operation of the robot 16 being controlled by a control device. The control device 40 is mainly constituted by a computer, and includes functional units such as a target operation position determination unit 42 and an operation command issuing unit 44 as illustrated in FIG. 2.

A movement position of the head 14 is defined by H(x,y,z) which is a coordinate value in a three-dimensional orthogonal coordinate system which has a predetermined reference position in a work space as a reference, and source data for performing the mounting work is defined by a value in a three-dimensional or two-dimensional orthogonal coordinate system. On the other hand, operation positions of the robot 16 are defined by R(θ1, θ2, θ3, θ4) which is a set of values of rotation positions of the shoulder 22, the upper arm 24, the lower arm 26, and the wrist 28 which respectively correspond to four axes θ1, θ2, θ3 and θ4. The target operation position determination unit 42 determines a target movement position H*(x*,y*,z*) of the head 14 on the basis of the source data, and determines target operation positions R*(θ1*, θ2*, θ3*, θ4*) on the basis of the target movement position H*(x*,y*,z*). Further, in the mounting machine, a target rotation position θ4* of the wrist 28 is determined such that the nozzle 20 maintains a posture extending in the vertical direction at all times.

The operation positions R(θ1, θ2, θ3, θ4) of the robot 16 are identified by an encoder 46 described above. The operation command issuing unit 44 obtains differences ΔR (θ1*−θ1, θ2*−θ2, θ3*−θ3, θ4*−θ4) between the identified operation positions R(θ1, θ2, θ3, θ4) and the target operation positions R*(θ1*, θ2*, θ3*, θ4*) at the very short time pitches, and determines command values (I1, I2, I3, I4) of currents which are to be supplied to the respective motors according to a PID control method or the like on the basis of the differences ΔR (θ1*−θ1, θ2*−θ2, θ3*−θ3, θ4*−θ4). In addition, the determined command values (I1, I2, I3, I4) are transmitted to drivers 48 which are the driving circuits of the respective motors, and currents corresponding to the command values (I1, I2, I3, I4) are supplied to the respective motors M from the drivers 48.

(c) Correction of Target Operation Positions in Control of Articulated Robot

The articulated robot 16 has lower rigidity than that of a so-called XY type robot, and thus there is a problem in that position accuracy of the head 14 is low. Particularly, in a case of a serial link type robot, the problem becomes serious. In addition, there is a possibility that the board S which is a workpiece may not be held at an accurate position by the board holding device 10. In light of this fact, in order to improve work accuracy, target operation positions are corrected on the basis of imaging data obtained through imaging performed by the lower camera 30 or the side camera 32 in the control of an operation of the robot 16 of the mounting machine.

As functional units for correcting the target operation positions, the control device 40 includes an imaging control unit 50 which controls imaging performed by the lower camera 30 or the side camera 32, a reference data holding unit 52 which holds reference data for a comparison process with the imaging data, a deviation detecting unit 54 which detects a deviation of an operation position on the basis of the imaging data and the reference data, and a target operation position correcting unit 56 which corrects a target operation position on the basis of the detected deviation.

The correction of a target operation position to be performed includes two types of corrections. One of the two types of corrections is a first correction which is aimed at the optimization of the mounting position of the component P on the board S, and the other correction is a second correction which is aimed at the optimization of the movement path of the head 14. The mounting machine can selectively perform either of the first correction and the second correction. Hereinafter, the two types of corrections will be described in order.

i) First Correction

The first correction aimed at the optimization of the mounting position is, simply stated, a correction based on the deviation between relative positions of the board S held by the board holding device 10 and the head 14, and, specifically, is a correction for removing the deviation. This correction is performed on the basis of imaging data obtained through imaging performed by the lower camera 30 and the reference data.

In the first correction, the reference data held in the reference data holding unit 52 includes data indicating the position of the board S or the component P in a case where the component P has already been mounted on the board S, that is, positions of a plurality of feature points of the workpiece in the board S. In other words, the reference data includes position data of the feature points, with a predetermined reference position as a reference in the work space, in a case where the board S is held at an accurate position by the board holding device 10. Each of the feature points is the center of an upper surface of each solder land (referred to as a "solder pad" in some cases) L printed on the board S, and is the center of an upper surface of the component P in a case where the component P has already been mounted. Specifically, the reference data is a set of position data items $SP_1(x_1,y_1,z_1)$, $SP_2(x_2,y_2,z_2)$, . . . of respective feature points $SP_1$, $SP_2$, . . . in the three-dimensional orthogonal coordinate system which has the reference position as a reference.

The reference data is created not on the basis of imaging data obtained by actually imaging the board S or the board S on which the component P is mounted but on the basis of design data (which may be design data of an electrical circuit) of the board S and the component P. Therefore, the amount of the reference data is relatively small, a process for creating the reference data can be relatively easily performed, and a comparison process between the reference data and imaging data described later can be rapidly performed.

In the course of the head 14 holding the component P being moved to the target movement position $H^*(x^*,y^*,z^*)$ corresponding to a mounting position of the component, the head 14 is decelerated and a process for the first correction is started when the lower camera 30 enters a region where the board S can be imaged. Specifically, first, the imaging control unit 50 issues a command for causing the lower camera 30 to perform imaging, and sends imaging data obtained through the imaging to the deviation detecting unit 54 in association with an operation position $R(\theta1, \theta2, \theta3, \theta4)$ of the robot 16 at the time of the imaging. FIG. 3 illustrates a partial image of the board S imaged by the lower camera 30, that is, a two-dimensional image in a single visual field of the lower camera 30, and imaging data corresponding to the image is sent to the deviation detecting unit 54.

With reference to FIG. 3, first, the deviation detecting unit 54 specifies two appropriate feature points SP1 and SP2 from among a plurality of feature points included in the imaging data on the basis of the sent imaging data. Next, position data regarding the two feature points SP1 and SP2 is extracted from the reference data, and then a deviation is detected on the basis of the imaging data and the extracted position data. For better understanding, first, on the basis of the sent operation position $R(\theta1, \theta2, \theta3, \theta4)$, the two specified feature points SP1 and SP2 to be imaged in a case where the robot 16 is operated at the positions are superimposed on the image as normalized feature points SP1' and SP2'. In addition, a relative positional deviation $(\delta x, \delta y, \delta z)$ between the board S and the head 14 is detected on the basis of positions SP1(x1,y1), SP2(x2,y2), SP1*(x1*,y1*), and SP2*(x2*, y2*) of the feature points SP1 and SP2 and the normalized feature points SP1* and SP2* according to a geometric method. The relative positional deviation $(\delta x, \delta y, \delta z)$ is a deviation in the three-dimensional orthogonal coordinate system which uses the reference position as a reference, and deviations $\delta R(\delta\theta1, \delta\theta2, \delta\theta3, \delta\theta4)$ regarding operation positions of the robot 14, that is, a correction amount, is obtained on the basis of the deviation. The target operation position correcting unit 56 corrects the target operation positions $R^*(\theta1^*, \theta2^*, \theta3^*, \theta4^*)$ on the basis of the obtained deviations $\delta R(\delta\theta1, \delta\theta2, \delta\theta3, \delta\theta4)$.

The above-described series of processes related to the first correction are repeatedly performed at pitches at which the series of processes can be performed until the head 14 arrives at the target movement position $H^*(x^*, y^*, z^*)$, that is, the robot 16 is moved to the target operation positions $R^*(\theta1^*, \theta2^*, \theta3^*, \theta4^*)$. In other words, during the movement of the head 14, the imaging control unit 50 sequentially causes the lower camera 30 to perform imaging, the deviation detecting unit 54 sequentially detects a deviation, and the target operation position correcting unit 56 sequentially corrects a target operation position.

Since the above-described correction process is performed, an operation position of the robot 16 is feedback-controlled on the basis of imaging data obtained by the lower camera 30 and the reference data. In addition, since the above-described correction process is performed, an operation of the robot is optimized on the basis of the imaging data. Specifically, since the electric component mounting work is performed such that a deviation of the board S relative to the board holding device 10, a positional deviation of the head 14 in the work space due to deficiency of the rigidity of the robot 16, and the like are removed, the first correction is performed, and thus accuracy of the work, especially, accuracy of a mounting position of the component P increases.

ii) Second Correction

The second correction which is aimed at the optimization of a movement path of the head 14 is, simply stated, a correction based on a deviation from a movement path along which the head 14 passes, and is, specifically, a correction for removing the deviation. This correction is performed on the basis of imaging data obtained through imaging performed by the side camera 32 and the reference data.

In the second correction, the reference data held in the reference data holding unit 52 includes position data regarding a plurality of feature points of the reference matrix drawn on the inner surface of the panel 34, with a predetermined reference position in the work space as a reference. The plurality of feature points are respective intersections between vertical lines and horizontal lines of the reference matrix 36. Specifically, the reference data is a set of position data items of respective feature points $SP_{11}$, $SP_{12}$, . . . , $SP_{21}$, $SP_{22}$, . . . in a three-dimensional orthogonal coordinate system which has the reference position as a reference.

The reference data may be created on the basis of imaging data obtained by actually imaging the panel 34, and may be created on the basis of design data of the work machine.

When the head 14 is moved to the next target movement position $H^*(x^*,y^*, z^*)$, an operation of the robot 16 is controlled such that the head is moved along the shortest movement path to the position, that is, a scheduled movement path. The imaging control unit 50 issues a command for causing the side camera 32 to image the reference matrix 36 drawn on the panel 34 during the movement of the head 14. In addition, imaging data for part of the reference matrix 36, obtained through the imaging based on the command is sent to the deviation detecting unit 54 in association with operation position $R(\theta1, \theta2, \theta3, \theta4)$ of the robot 14 at the time of the imaging. FIG. 4 illustrates a partial image of the reference matrix 36 imaged by the side camera 32, that is, a two-dimensional image in a single visual field of the side camera 32, and imaging data corresponding to the image is sent to the deviation detecting unit 54.

With reference to FIG. 4, in the same manner as in the above-described first correction, the deviation detecting unit 54 specifies two appropriate feature points SP1 and SP2 from among a plurality of feature points included in the imaging data on the basis of the sent imaging data. Next, position data regarding the two feature points SP1 and SP2 is extracted from the reference data, and then a deviation is detected on the basis of the imaging data and the extracted position data. According to the process described above in the first correction, a positional deviation (δx,δy,δz) of the head 14 from the movement path is detected on the basis of positions SP1(x1,y1), SP2(x2,y2), SP1*(x1*,y1*), and SP2* (x2*, y2*) of the feature points SP1 and SP2 and the normalized feature points SP1* and SP2* corresponding thereto. Deviations δR(δθ1, δθ2, δθ3, δθ4) regarding operation positions of the robot 14, that is, a correction amount, is obtained on the basis of the positional deviation (δx,δy, δz). The target operation position correcting unit 56 corrects the target operation positions R*(θ1*, θ2*, θ3*, θ4*) which are determined so as to correspond to the target movement position H*(x*,y*,z*), on the basis of the obtained deviations δR(δθ1, δθ2, δθ3, δθ4).

The above-described series of processes related to the second correction are repeatedly performed at pitches at which the series of processes can be performed until the head 14 arrives at the target movement position H*(x*,y*, z*). In other words, in all procedures during the movement of the head 14, the imaging control unit 50 sequentially causes the side camera 32 to perform imaging, the deviation detecting unit 54 sequentially detects a deviation, and the target operation position correcting unit 56 sequentially corrects a target operation position.

Since the above-described correction process is performed, an operation position of the robot 16 is feedback-controlled on the basis of imaging data obtained by the side camera 32 and the reference data. In addition, since the above-described correction process is performed, the head 14 is moved to the next target operation position without being greatly deviated from the scheduled movement path. Therefore, the second correction is very useful, for example, in a case where work is performed which causes a concern that a deviation from the scheduled movement path of the head 14 may interfere with part of the mounting machine of the head 14. Since the second correction is performed, an operation of the robot is optimized on the basis of imaging data, and thus accuracy of the work increases.

(d) Modification Examples

The above-described Example relates to an electric component mounting machine, but the present disclosure is applicable to various work machines provided with various work heads. The robot 16 in the mounting machine of the above-described Example is an articulated robot having four control axes, but the present invention is applicable to a work machine employing articulated robots having three or less or five or more control axes. In addition, the present disclosure is also applicable to a work machine employing a so-called XYZ type robot constituted by XYZ orthogonal type movement devices, instead of the articulated robot.

In the above-described Example, the lower camera 30 and the side camera 32 which are imaging devices are attached to the wrist 28 of the robot 16 but may be attached to the work head. In addition, the present disclosure is also applicable to a work machine to which not two imaging devices but a single imaging device is attached.

In the above-described Example, two corrections including the first correction and the second correction can be selectively performed, but either the first correction or the second correction may be performed. In the above-described Example, a deviation is detected by using two feature points, but a deviation may be detected according to a geometric method different from the previous one by using three or more feature points. In addition, in the first correction, the center of the solder land L or the mounted component P is set as a feature point, but a corner of the solder land L or the mounted component P, or part of the board S other than the corner may be set as a feature point. Further, in a case where a component such as a connector component which is inserted or fitted into a hole provided in the board S is mounted, a feature point may be set on the basis of the hole. Still further, in the second correction, the reference matrix 36 drawn on the single panel 34 is used, but a deviation may be detected by using reference matrices which are respectively drawn on two or more panels which face each other or intersect each other. Furthermore, a feature point may be provided on portions other than the panel of the work machine, for example, a body portion, and a deviation may be detected by using the feature point.

REFERENCE SIGNS LIST

14: COMPONENT HOLDING HEAD (WORK HEAD)
16: ARTICULATED ROBOT
30: LOWER CAMERA (IMAGING DEVICE)
32: SIDE CAMERA (IMAGING DEVICE)
34: PANEL
36: REFERENCE MATRIX
40: CONTROL DEVICE
42: TARGET OPERATION POSITION DETERMINATION UNIT
44: OPERATION COMMAND ISSUING UNIT
46: ENCODER
50: IMAGING CONTROL UNIT
52: REFERENCE DATA HOLDING UNIT
54: DEVIATION DETECTING UNIT
56: TARGET OPERATION POSITION CORRECTING UNIT
S: CIRCUIT BOARD (WORKPIECE)
P: ELECTRIC COMPONENT (WORKPIECE)
L: SOLDER LAND

The invention claimed is:

1. A work machine comprising:
  a work head;
  an articulated robot that holds the work head and moves the work head with respect to a workpiece by rotating motors corresponding to control axes of the articulated robot, the workpiece being a circuit board on which a plurality of components are mounted;
  a control device that includes
    a target operation position determination unit which determines a target operation position of the articulated robot, and
    an operation command issuing unit which issues an operation command to the articulated robot, and that controls the articulated robot on the basis of the target operation position; and
  an imaging device that is attached to the work head, or the articulated robot in the vicinity of the work head, the imaging device including a lower camera which images at least part of the workpiece, and a side camera which images a reference matrix provided on the work machine, the reference matrix including a plurality of vertical lines and a plurality of horizontal lines intersecting each other,
  wherein the control device further includes
    a reference data holding unit that holds reference data which is data created on the basis of design data of the workpiece and which includes data items respectively indicating positions of a plurality of feature points of the workpiece corresponding to solder lands and components on the circuit board, and data items indicating positions of a plurality of feature points set for part of the work machine, the positions having the work space as a reference, and the feature points being intersections between the vertical lines and the horizontal lines of the reference matrix, a deviation detecting unit that detects a deviation between relative positions of the work head and the workpiece on the basis of imaging data obtained through imaging performed by the imaging device and the reference data, and a target operation position correction unit that corrects the target operation position of the control axes of the articulated robot on the basis of the deviation detected by the deviation detecting unit, wherein the deviation detecting unit specifies two feature points on the workpiece to be imaged at the time of the imaging performed by the imaging device among the plurality of feature points, extracts position data of the two feature points from the reference data based on the design data of the workpiece, detects a relative positional deviation based on the imaging data of the two feature points and the extracted position data of the two feature points, the relative positional deviation being a deviation in a three-dimensional orthogonal coordinate system which uses the extracted position data of the two feature points as a reference, and obtains a deviation regarding operation positions of the control axes of the robots based on the relative positional deviation.

2. The work machine according to claim 1, wherein the control device further includes an imaging control unit that causes the imaging device to sequentially perform imaging during the movement of the work head, wherein the deviation detecting unit sequentially detects the deviation on the basis of imaging data obtained through the imaging which is sequentially performed by the imaging device, and the target operation position correcting unit sequentially corrects the target operation position on the basis of the deviation which is sequentially detected by the deviation detecting unit.

3. The work machine according to claim 1, wherein the work head is an electric component holding head which detachably holds a supplied electric component, and the articulated robot moves the component holding head holding an electric component in order to mount the held electric component on a circuit board, so that the work machine functions as an electric component mounting machine.

4. The work machine according to claim 2, wherein the work head is an electric component holding head which detachably holds a supplied electric component, and the articulated robot moves the component holding head holding an electric component in order to mount the held electric component on a circuit board, so that the work machine functions as an electric component mounting machine.

5. The work machine according to claim 1, wherein the robot includes a shoulder which rotates about a first control axis in a horizontal plane with respect to a base of the robot, an upper arm which rotates about a second control axis with respect to the shoulder, a lower arm which rotates about a third control axis with respect to the upper arm, and a wrist which rotates about a fourth control axis with respect to the lower arm and to which the work head is fixed and held, wherein the shoulder, the upper arm, the lower arm, and the wrist are separately rotated by four respective motors corresponding to the four control axes, and wherein the second, third, and fourth control axes are each perpendicular to the first control axis.

* * * * *